(12) United States Patent
Kwon

(10) Patent No.: US 12,047,046 B2
(45) Date of Patent: Jul. 23, 2024

(54) SYSTEM AND METHOD FOR AUTO CALIBRATION IN A POWER BLACKOUT SENSING SYSTEM

(71) Applicant: Ig Soo Kwon, San Ramon, CA (US)

(72) Inventor: Ig Soo Kwon, San Ramon, CA (US)

( * ) Notice: Subject to any disclaimer, the term of this patent is extended or adjusted under 35 U.S.C. 154(b) by 176 days.

(21) Appl. No.: 17/721,885

(22) Filed: Apr. 15, 2022

(65) Prior Publication Data

US 2022/0337208 A1 Oct. 20, 2022

Related U.S. Application Data

(60) Provisional application No. 63/175,996, filed on Apr. 16, 2021.

(51) Int. Cl.
*H03G 3/30* (2006.01)
*G01R 31/42* (2006.01)
*H03F 3/04* (2006.01)
*H03K 3/037* (2006.01)

(52) U.S. Cl.
CPC ............ *H03G 3/30* (2013.01); *G01R 31/42* (2013.01); *H03F 3/04* (2013.01); *H03K 3/037* (2013.01); *H03G 2201/103* (2013.01)

(58) Field of Classification Search
CPC ......... H03F 1/086; H03F 2200/78; H03F 1/56
See application file for complete search history.

(56) References Cited

U.S. PATENT DOCUMENTS

| | | | | |
|---|---|---|---|---|
| 5,532,918 A | * | 7/1996 | Mayrand | H02M 1/4225 363/126 |
| 10,931,265 B1 | * | 2/2021 | Zhao | H03K 7/08 |
| 2002/0163381 A1 | * | 11/2002 | Burt | H03F 3/45941 330/69 |
| 2009/0212860 A1 | * | 8/2009 | Fukuzawa | H03G 3/30 330/181 |
| 2010/0019842 A1 | * | 1/2010 | Larson | H03F 3/45928 330/278 |
| 2014/0183959 A1 | | 7/2014 | Kabasawa et al. | |
| 2015/0229160 A1 | | 8/2015 | Kawakami et al. | |
| 2015/0288223 A1 | | 10/2015 | Sato et al. | |
| 2020/0358406 A1 | * | 11/2020 | Pandey | H03M 1/66 |

FOREIGN PATENT DOCUMENTS

EP 2910957 A1 8/2015

* cited by examiner

*Primary Examiner* — Jermele M Hollington
*Assistant Examiner* — Temilade S Rhodes-Vivour

(57) ABSTRACT

A calibration amplifier includes: a plurality of transistors and a variable resistor configured to change in response to clock pulses. During a calibration cycle, one of the plurality of transistors switches on in each calibration step based on a plurality of enable signals, and a gain of the calibration amplifier changes until an output voltage of the calibration amplifier exceeds a reference voltage and is set to a calibrated gain. The calibration amplifier outputs the output voltage by amplifying an input voltage using the calibrated gain.

20 Claims, 8 Drawing Sheets

SYSTEM AND METHOD FOR AUTO CALIBRATION IN A POWER BLACKOUT SENSING SYSTEM

CROSS-REFERENCE TO RELATED APPLICATION(S)

This application claims the benefits of and priority to U.S. Provisional Patent Application Ser. No. 63/175,996 filed Apr. 16, 2021, the disclosure of which is incorporated herein by reference in its entirety.

TECHNICAL FIELD

The present disclosure relates generally to a system and method for automatically calibrating an amplifier gain of a power blackout sensing system.

BACKGROUND

In general, a live power is required for an emergency power surge detector or an emergency light integrating the same to operate in a power shutdown condition. For residential or commercial applications, a power utility construction is required to provide a live power to an emergency lighting system, but it is not only inconvenient but also costly. Moreover, such an emergency lighting system that relies on a live power supply may not work in a power blackout condition because the live power supply to the emergency lighting system may be completely cut off due to the power blackout condition.

The emergency lighting system is desired to be used in various operations conditions and environments. When the emergency lighting system uses a feedback amplifier that amplifies an input signal with a fixed voltage gain, it may fail to correctly detect a power outage condition, and it may result in a malfunction. For example, if the fixed gain of the feedback amplifier is set too high, a small noise in the input voltage may be falsely amplified, and the system may erroneously interpret it as a normal power condition. If the fixed voltage gain set too low, the input voltage may not be sufficiently amplified even in a normal power condition, and the system may erroneously interpret it as a power outage condition.

SUMMARY

According to one embodiment, a calibration amplifier includes: a plurality of transistors and a variable resistor configured to change in response to clock pulses. During a calibration cycle, one of the plurality of transistors switches on in each calibration step based on a plurality of enable signals, and a gain of the calibration amplifier changes until an output voltage of the calibration amplifier exceeds a reference voltage and is set to a calibrated gain. The calibration amplifier outputs the output voltage by amplifying an input voltage using the calibrated gain.

According to another embodiment, a power blackout sensing system includes: a voltage regulator configured to receive one of three phase wires and a neutral wire of a primary power source that provides an alternating current (AC) power; a calibration amplifier comprising a plurality of transistors and a variable resistor that is configured to change in response to clock pulses; a voltage sense amplifier; a sensing block configured to receive the neutral wire of the primary power source and comprising a coupled inductor device and the voltage sense amplifier; and a secondary power source. The voltage regulator is coupled to a switch and generates a direct current (DC) voltage signal. The coupled inductor device of the sensing block comprises a pull-down resistor, wherein the coupled inductor device is configured to convert a voltage signal of the neutral wire to a 180-degree phase-shifted voltage signal of the neutral wire and generate a reference voltage signal using the pull-down resistor. The voltage sense amplifier is configured to amplify a voltage gap between the 180-degree phase-shifted voltage signal of the neutral wire and the reference voltage signal. During a calibration cycle, one of the plurality of transistors of the calibration amplifier switches on in each calibration step based on a plurality of enable signals, and a gain of the calibration amplifier changes until an output voltage of the calibration amplifier exceeds the reference voltage and is set to a calibrated gain. The calibration amplifier outputs the output voltage by amplifying an input voltage using the calibrated gain. The sensing block detects a phantom voltage on the one of three phase wires and provides an output signal corresponding the secondary power source during a blackout period.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
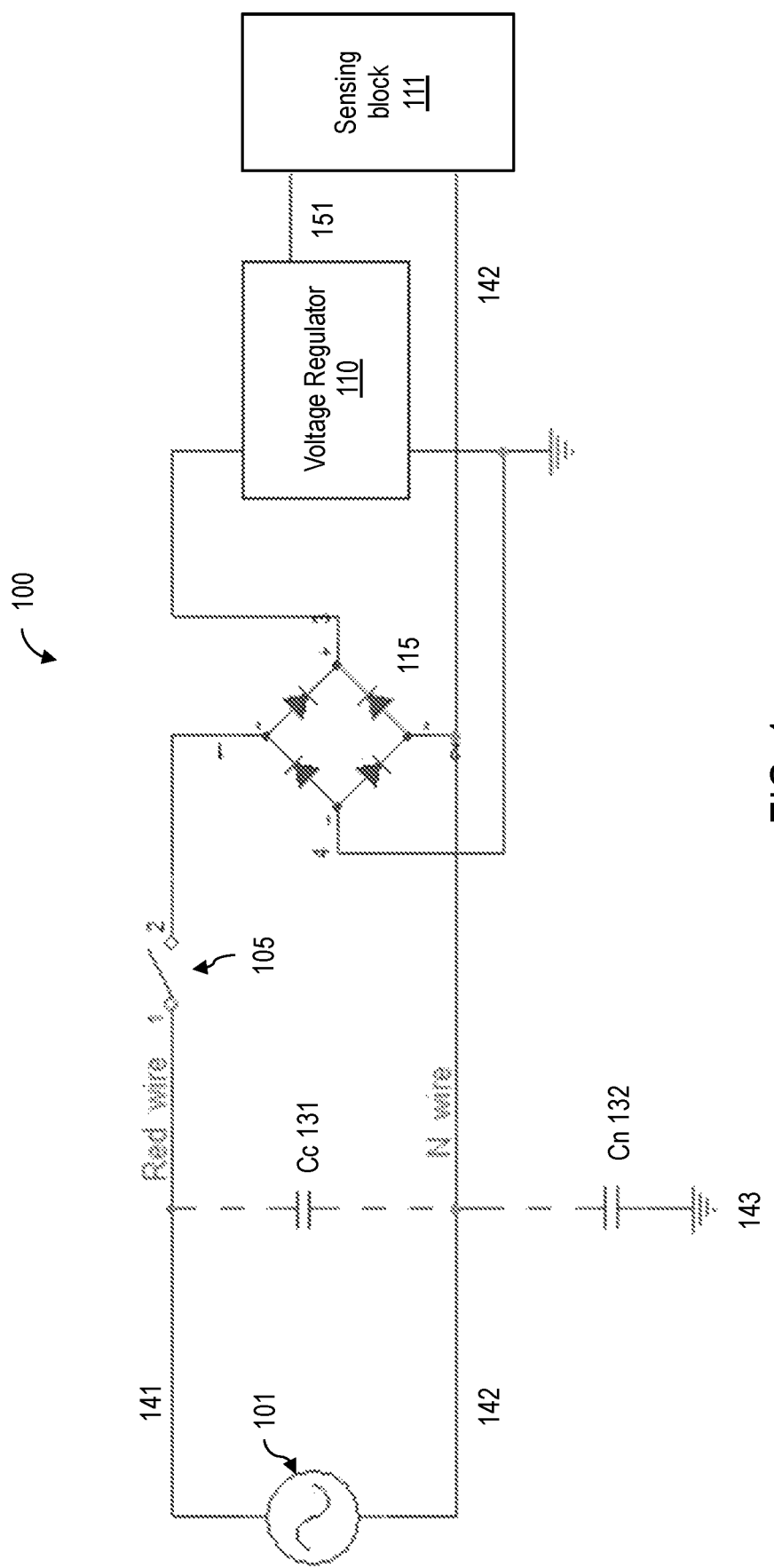
FIG. 1 shows a block diagram of an example power blackout sensing system, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a power blackout sensing system including a phantom voltage detector. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure describes a system and method for automatically calibrating a power blackout sensing system. The power blackout sensing system may include a secondary power source (e.g., a battery, a super capacitor) and a phantom voltage detector and may be coupled to an external device or system. According to one embodiment, the external device is a light emitting diode (LED) light. The phantom voltage detector can distinguish a switch on/off condition from a power blackout condition. In a power blackout condition, the phantom voltage detector may generate a signal to supply a secondary power to the coupled device or system until the main power to the system is restored.

The power blackout sensing system can reduce or eliminate a need for constructing power utility (e.g., wiring to a permanent live power supply or a secondary power supply) to build an emergency lighting system. Therefore, the cost, time, and effort for implementing an emergency lighting system can be saved. Other applicable examples of the power blackout sensing system include, but are not limited to, medical equipment and high-precision machines that require an uninterrupted operation even in a power blackout condition.

An LED light may integrate the power blackout sensing system and include a battery and a phantom voltage detector. The LED light may detect a power blackout condition using the integrated phantom voltage detector. The LED light may be used as an emergency light in a complete power blackout condition.

According to one embodiment, the LED light may further integrate an auto calibration system. The LED light may efficiently detect a power blackout condition using the integrated phantom voltage detector and adapt to various operating conditions using the auto calibration system.

The present auto calibration system determines an adjustable voltage sensing gain of the power blackout sensing system instead of using a fixed voltage sensing gain. When a feedback amplifier uses a fixed voltage gain, the following problems may occur.

In a case where the fixed gain is set too high, during a power outage, $V_{AC}$ is 0V, but a small noise in the value of an input voltage (e.g., V_N_wall) may be amplified, and it may be interpreted as a normal power condition. This may result in malfunction of the power blackout sensing system.

In a case where the fixed voltage gain set too low, during a normal power condition, the input voltage may not be sufficiently amplified, and it may be erroneously interpreted as a power outage condition.

The present automatic calibration system applies an optimal voltage sensing gain to resolve the issues that may occur with a fixed voltage gain and may provide a stable and reliable operation of the power blackout sensing system regardless of a voltage input from a voltage converter transformer (e.g., V_N_wall) and/or an alternating current (AC) power source (e.g., Vo_dc).

FIG. 1 shows a block diagram of an example power blackout sensing system, according to one embodiment. A power blackout sensing system 100 includes an AC power source 101, a switch 105, a rectifier 115, a voltage regulator 110, and a sensing block 111.

According to one embodiment, the AC power source 101 is a three-phase AC power source including three wires (e.g., black, red, and white wires) and a neutral wire 142 (e.g., a bare copper wire). Among the three wires, two wires (e.g., a red wire 141 and the neutral wire 142) can be connected to the sensing block 111 that can detect a phantom voltage. The voltage regulator 110 receives rectified signals from the rectifier 115 and generates a direct voltage (DC) signal 151. The voltage signal 151 and the neutral wire 142 are connected to the sensing block 111. The present example will be described for an exemplary case where the red and neutral wires are connected to the sensing block 111; however, it is noted that any other two wires can be connected to the sensing block without deviating from the scope of the present disclosure.

In the present example, the neutral wire 142 is always connected to the sensing block 111 while the red wire 141 is connected to the switch 105. Parasitic capacitances exist between the red wire 141 and the neutral wire 142, and between the neutral wire 142 and the ground 143, respectively. The parasitic capacitor Cc 131 represents a parasitic capacitor between the red wire 141 and the neutral wire 142, and the parasitic capacitor Cn 132 represent a parasitic capacitor between the neutral wire 142 and the ground 143.

During a normal power-on condition, the AC power source 101 exhibits three phases including a first phase between the black wire and the neutral wire 142 (e.g., AC 100V), a second phase between the red wire 141 and the neutral 142 (e.g., AC 100V), and a third phase between the black wire and the red wire 141 (e.g., AC 200V).

When the switch is off, a phantom voltage V_phantom that is biased to the neutral wire 142 can be expressed as:

$$V\_phantom = V\_redwire * (Cc)/(Cn+Cc) \quad \text{(Eq. 1)}$$

Herein, the phantom voltage V_phantom can be small because the parasitic capacitor Cc is relatively small compared to the parasitic capacitor Cn. In a case where the amount of charges stored in the parasitic capacitors is small, the parasitic capacitors cannot be used a secondary power source.

For example, if the parasitic capacitance values are the same, i.e., Cc Cn, the phantom voltage can be expressed as:

$$V\_phantom = 0.5 * V\_redwire.$$

When the switch 105 is off, the neutral wire 142 exhibits the phantom voltage, and the red wire 141 exhibits 0 volt. When the power is off (e.g., in a blackout condition), both the neutral and red wires exhibit 0 volt.

Figure 2:
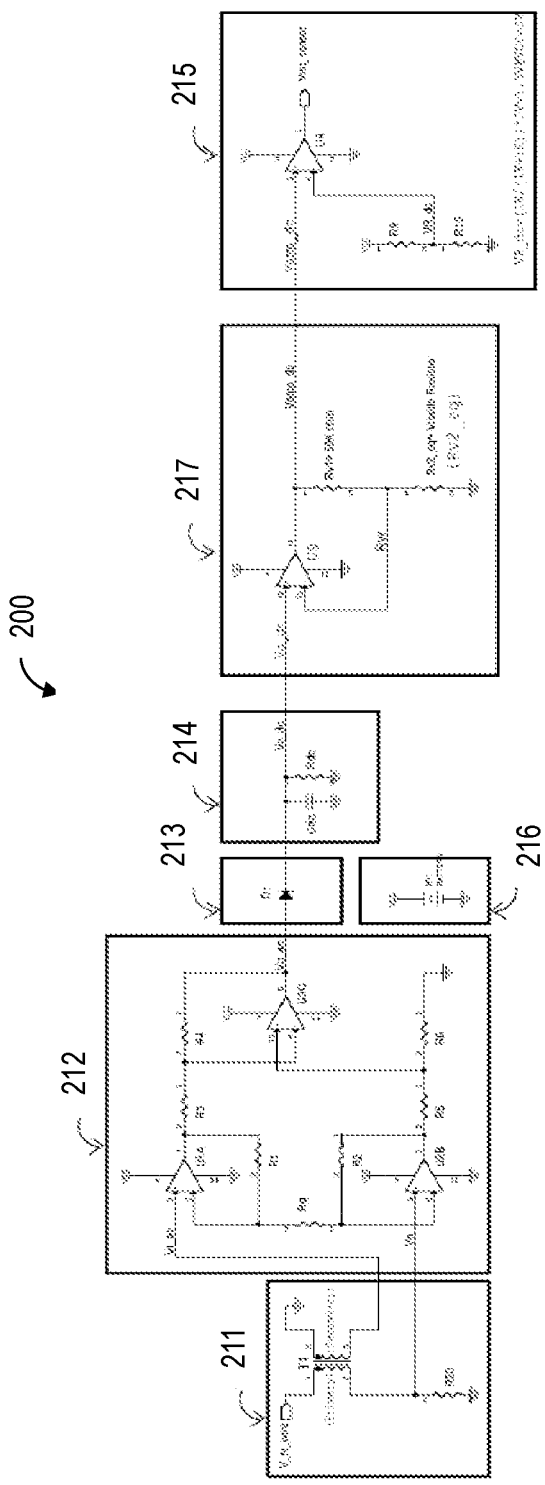
FIG. 2 shows an example power blackout sensing system including a secondary power source, according to one embodiment.

FIG. 2 shows an example power blackout sensing system including a secondary power source, according to one embodiment. A power blackout sensing system 200 includes a voltage transformer 211 (or a Choke coil) with a 180-degree phase shift, a voltage sense amplifier 212, a direct current (DC) clamp 213, an AC-to-DC converter (ADC) 214, a voltage comparator 215, a battery 216, and an auto calibration feedback amplifier 217. According to one embodiment, the power blackout sensing system 200 may correspond to the sensing block 111 of FIG. 1.

According to one embodiment, the voltage transformer 211 may generate a reference voltage signal Vn using the voltage V_N_wire of the neutral wire. For example, the voltage transformer 211 that shifts phases (e.g., by 180 degrees) of the voltage V_N_wire may also generate the reference voltage signal Vn. In this case, a voltage gap between the voltage V_N_wire and an AC reference voltage Vr_ac that is output from the voltage transformer 211 becomes 2*(V_N_wire)*ratio, wherein ratio is a transform ratio of the voltage transformer 211). The voltage gap between the voltage V_N_wire and the reference voltage signal Vn may be amplified using the ratio of the voltage transformer 211 greater than 1.

The voltage transformer 211 may have a predetermined transform ratio based on the number of turns of wires on a primary side and/or a secondary side. For example, the number of turns of wires on the primary side is referred to as N_primary, and the number of turns of wires on the secondary side is referred to as N secondary. In this case, the transform ratio of the voltage transformer 211 is determined by N secondary/N_primary. When the transform ratio is 1, the output voltage Vr_ac=−Vn.

Referring to FIG. 1, when the switch 105 is off, the red wire 141 is in a floating state, therefore the red wire 141 may not be used for detecting a phantom voltage. However, as discussed above, the neutral wire 142 may exhibit a phantom voltage during a switch-on or switch-off period. This phantom voltage that appears on the neutral wire 142 is herein referred to as the voltage V_N_wire. A conventional single-ended voltage sense amplifier may not be adequate for amplifying the phantom voltage because the voltage V_N_wire and the ground of the sensor block 111 may not be connected to each other.

The voltage sense amplifier 212 includes a plurality of amplifiers U1A, U2B, and U3C, and a plurality of resistors R1, R2, and Rg. The amplifiers U1A, U2B, and U3C receives the voltage Vcc of the secondary power source, the battery 216. The voltage sense amplifier 212 receives two input signals Vr_ac and Vn and generates an amplified signal Vo_ac that is amplified from a voltage gap between the two input signals Vr_ac and Vn. The output voltage signal Vo_ac of the voltage sense amplifier 212 is calculated by:

$$Vo\_ac = (Vn - Vr\_ac) * AV,$$

where $AV = (1 + 2R1/Rg * (R2/R1))$.

The DC clamp 213 includes a diode D1. The DC clamp 213 cancellate unexpected offset voltage of the voltage sense amplifier 212 using the diode D1. The output of the diode D1 is a direct current (DC) voltage signal Vo_dc.

The ADC 214 receives the voltage output signal from the DC clamp 213. The DC voltage signal Vo_dc that is output from the ADC 214 is calculated by:

$$Vo\_dc = (2V - Vt\_diode),$$

where Vt_diode is a threshold voltage of the diode D1. To be able to convert the AC voltage input to the DC voltage output, the following condition should be met:

$$Rdc * Cdc > (1/(2*3.14)*f),$$

where f is the frequency of the voltage V_N_wire on the neutral wire. When the switch is off, the DC voltage signal Vo_ac is expected to be 2V (assuming that the voltage V_N_wire=20 mV, and the voltage V_ac between the red wire 141 and the neutral wire 142 is 100V).

The voltage comparator 215 includes an amplifier U4 and resistors R9 and R10. The resistor R9 and R10 are serially connected between the voltage Vcc of the battery 216 and a ground. Both the voltage VR_dc that is divided by the resistors R9 and R10 and the DC voltage output Vo_dc from the ADC 214 are fed to the amplifier U4 to generate a sensor voltage Ven_sensor. When the DC voltage signal Vo_dc is greater than VR_dc, the sensor voltage signal Ven_sensor is Vcc. When the DC voltage signal Vo_dc is less than the voltage VR_dc, the sensor voltage signal Ven_sensor is 0V. For example, the voltage VR_dc=1.85 V, when Vcc=3.7 VDC and R9=R10. In other words, when the switch is on or off, the DC voltage signal Vo_dc is greater than VR_dc, therefore the sensor voltage signal Ven_sensor is Vcc. When the power blackout occurs, the DC voltage Vo_dc is less than VR_dc, therefore the sensor voltage signal Ven_sensor becomes 0V.

According to one embodiment, the auto calibration feedback amplifier 217 is coupled to the ADC 214 and the voltage comparator 215. The auto calibration feedback amplifier 217 receives the DC voltage Vo_dc that is output from the ADC 214, amplifies the DC voltage Vo_dc using a variable resistor Rv2_eq, and outputs the voltage Vamp_dc to the voltage comparator 215. The auto calibration feedback amplifier 217 is described in further detail with reference to FIG. 5.

Figure 3:
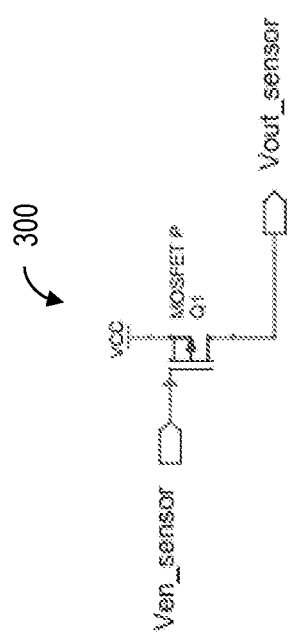
FIG. 3 shows an example power driver block, according to one embodiment.

FIG. 3 shows an example power driver block, according to one embodiment. The power driver block 300 receives the sensor voltage signal Ven_sensor from the power blackout sensing system 200 and generates a sensor output signal Vout_sensor. During a normal switch-on period or a switch-off period, the sensor voltage signal Ven_sensor is Vcc (e.g., 3.7 VDC) of the battery 216 of FIG. 2, and the sensor output signal Vout_sensor is zero. At the power blackout, the sensor voltage signal Ven_sensor is 0V, and the sensor output signal Vout_sensor is the voltage Vcc of the battery 216.

Figure 4:
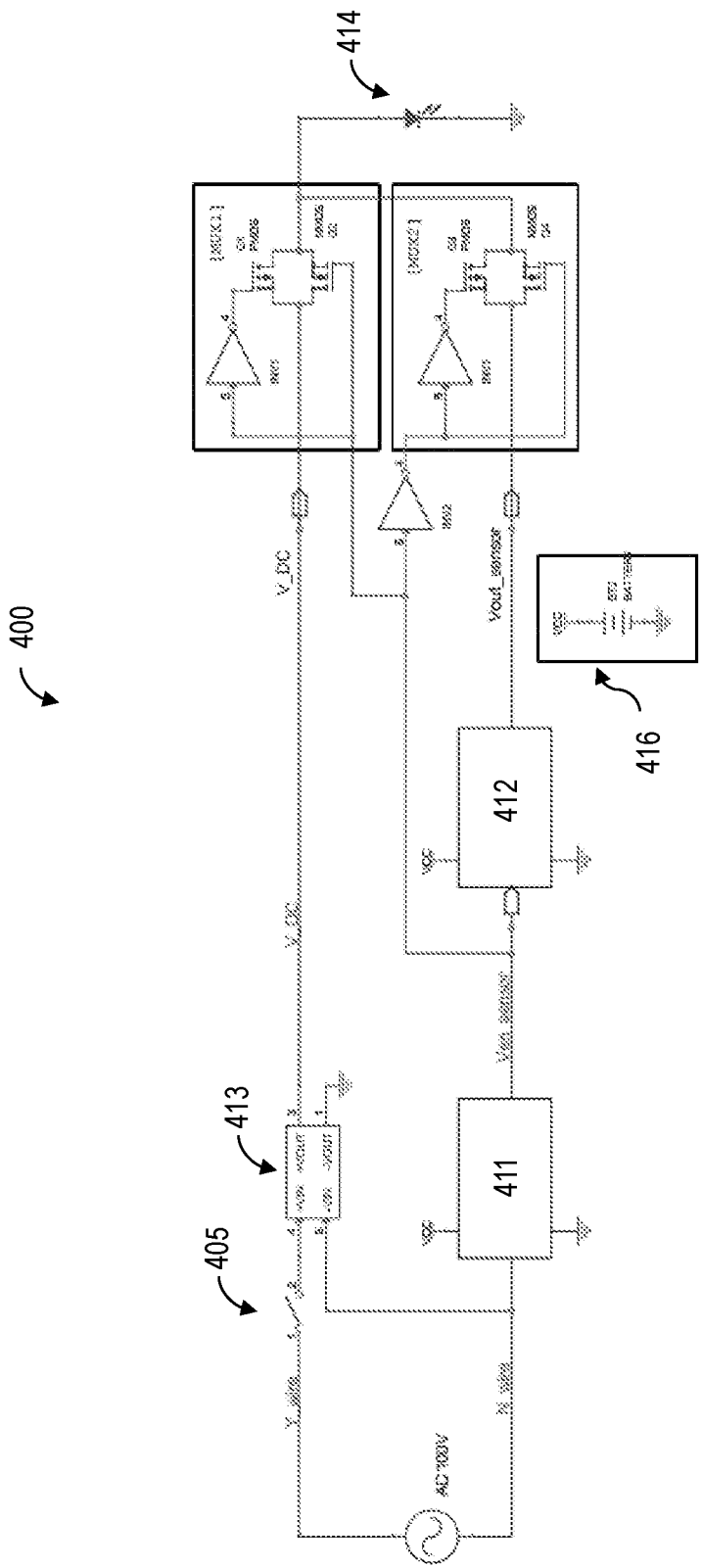
FIG. 4 shows an example power blackout sensing system, according to one embodiment.

FIG. 4 shows an example power blackout sensing system, according to one embodiment. The power blackout sensing system 400 includes a sensor block 411, a power driver block 412, two multiplexers MUX1 and MUX2, a voltage regulator 413, an LED light 414, and a battery 416. The sensor block 411 generates the sensor voltage signal Ven_sensor by sensing a phantom voltage on a wire (e.g., a neutral wire) differently when the power is on/off and a power blackout occurs. The sensor block 411 is connected to the power driver block 412 by a wire connection and controls the power driver block 412 to determine whether to power the LED light 414 using the secondary power of the battery 416.

When the switch 405 is on, the voltage regulator 413 generates a DC voltage V_DC (e.g., 3.7 VDC). Because the switch 405 is turned on, the sensor voltage signal Ven_sensor is output with the voltage of the battery 416 (e.g., 3.7 VDC), and the multiplexer MUX1 is turned on and outputs the DC voltage V_DC to turn on the LED light 414. In this case, the sensor output signal Vout_sensor=0V. When the switch 405 is turned off, the voltage regulator 413 does not output the DC voltage V_DC, therefore the multiplexer MUX1 does not output the DC voltage to power on the LED light 414. In this case, the sensor output signal Vout_sensor=0V, therefore the multiplexer MUX2 is not on, and the LED light 414 is not turned on. When a power blackout occurs, the voltage regulator 413 does not operate (no V_DC), however, the sensor output signal Vout_sensor=Vcc, therefore the second multiplexer MUX 2 is on, and the LED light 414 is powered on using the secondary power (Vcc) from the battery 416.

Figure 5:
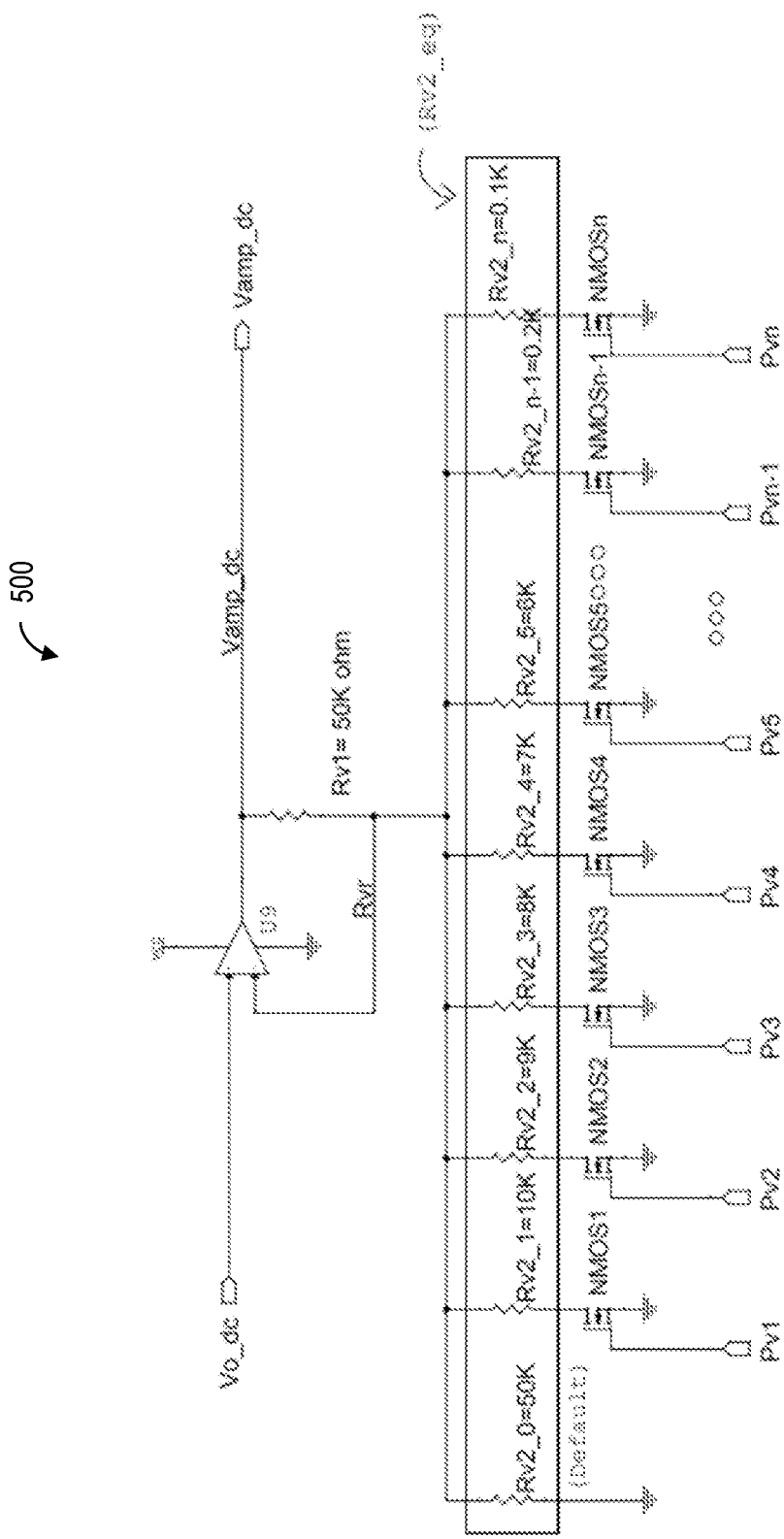
FIG. 5 shows an example of an auto calibration feedback amplifier, according to one embodiment.

FIG. 5 shows an example of an auto calibration feedback amplifier, according to one embodiment. The auto calibration feedback amplifier 500 shown in FIG. 5 may correspond to the auto calibration feedback amplifier 217 shown in FIG. 2. The auto calibration feedback amplifier 500 may include an amplifier U9, a plurality of n-channel metal-oxide semiconductor (NMOS) transistors (e.g., NMOS1, NMOS2, NMOS3, ... NMOS_n-1, NMOSn), a resistor Rv1, and a variable resistor Rv2_eq. The auto calibration feedback amplifier 500 receives an input voltage of Vo_dc and generates an amplified output voltage Vamp_dc. The input voltage Vo_dc may be an output voltage of the ADC 214 as shown in FIG. 2.

The variable resistor Rv2_eq may include a plurality of resistors (e.g., Rv2_0, Rv2_1, Rv2_2, Rv2_3, ..., Rv2_$n$-1, and Rv2_$n$) that are connected in parallel. Each of the resistors comprising the variable resistor Rv2_eq may be connected to the corresponding NMOS transistor except the first resistor Rv2_0 that is connected to the ground without a transistor. The resistor values of the plurality of resistors may vary. For example, Rv2_0 is 50K ohm, Rv2_1 is 10K ohm, Rv2_2 is 9K ohm, Rv2_3 is 8K ohm, ..., Rv2_$n$-1 is 0.2K ohm, and Rv2_$n$ is 0.1K ohm. The resistor value of the resistor Rv1 may be 50K ohm, which is same as that of the resistor Rv2_0 of the variable resistor Rv2_eq. In one embodiment, the increment or decrement of the resistor values may be determined based on the number of resistors included in the variable resistor Rv2_eq.

A voltage gain Av of the amplifier U9 may be expressed as Av=((1+(Rv1/Rv2_eq)). During a calibration cycle, the NMOS transistors NMOS1, NMOS2, NMOS3, ... NMOSn turn on one by one based on enable signals Pv1, Pv2, Pv3, Pvn-1, and Pvn, and the variable resistor Rv2_eq may change its resistor value accordingly. The changing resistor value of the variable resistor Rv2_eq makes the voltage gain Av to increase and decrease based on the equation above.

Figure 6:
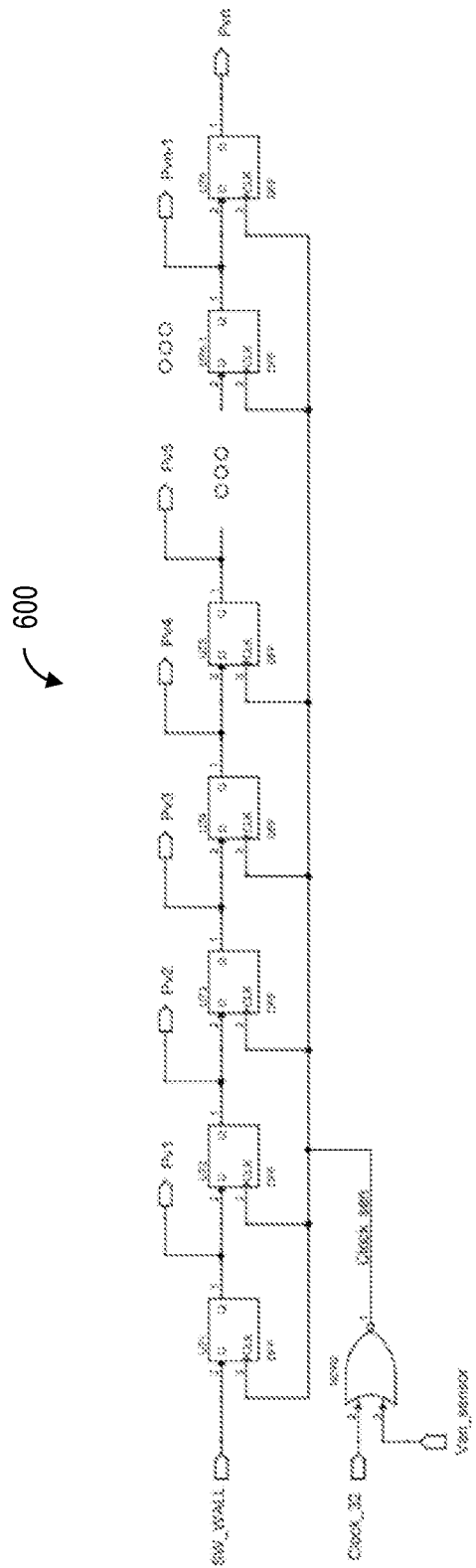
FIG. 6 shows an example a D-type flip-flop counter, according to one embodiment.

FIG. 6 shows an example a D-type flip-flop counter 600, according to one embodiment. The D-type flip-flop counter 600 may generate the enable signals Pv1, Pv2, Pv3, Pvn-1, and Pvn for the plurality of NMOS transistors NMOS1, NMOS2, NMOS3, ... NMOSn shown in FIG. 5. The D-type flip-flop counter 600 may include a plurality of flip-flops U71, U72, U73, ..., U7$n$-1, U7$n$, and an NOR2 gate. When SW_WALL enables a high pulse during each of the clock periods of Clock_32 and Ven_sensor is 'Low', the high pulse shift to Pv1, Pv2, Pv3, ..., Pvn-1, and Pvn toggles every clock period of Clock_32.

Figure 7:
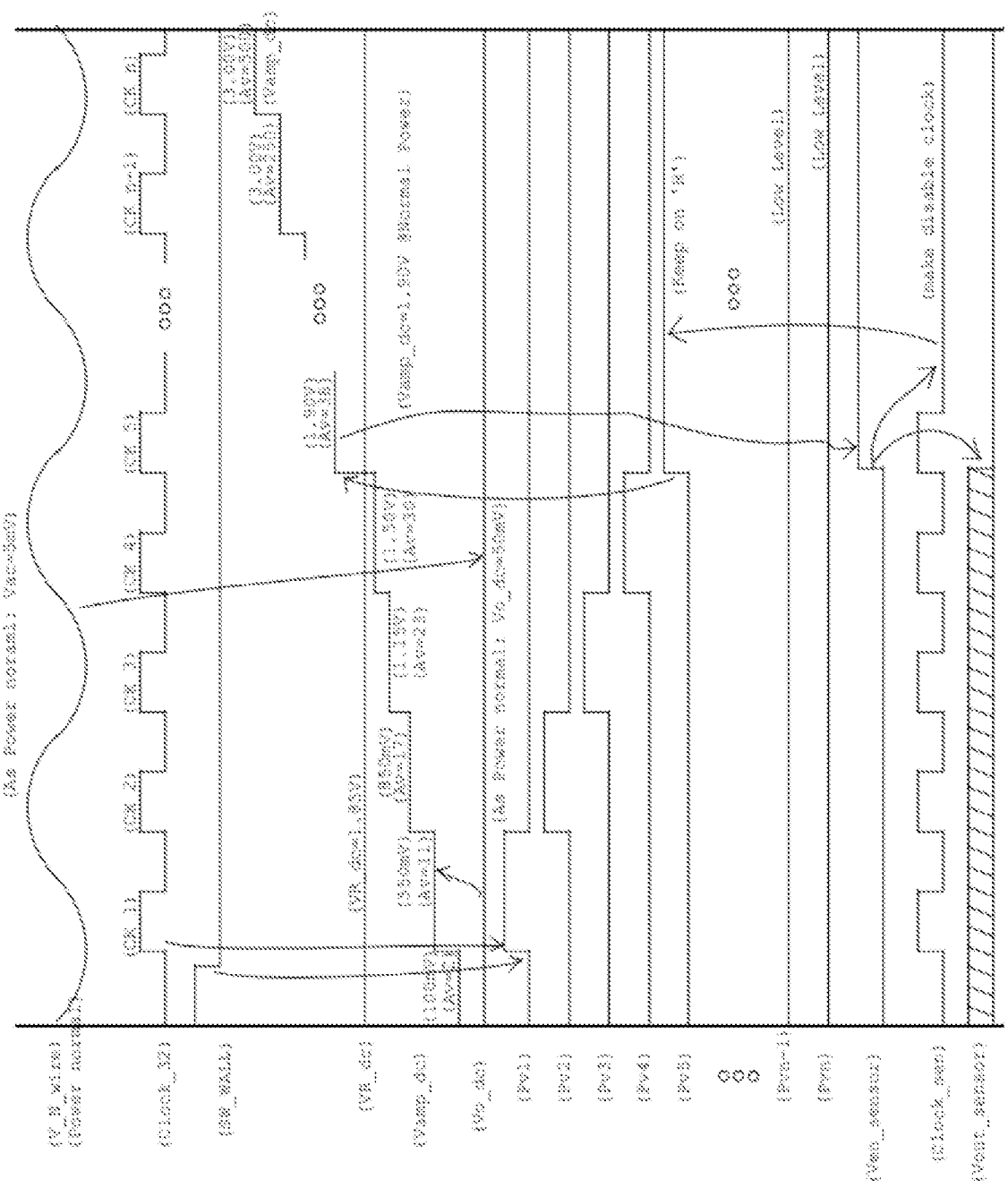
FIG. 7 shows an example timing diagram in a normal power condition, according to one embodiment.

FIG. 7 shows an example timing diagram in a normal power condition, according to one embodiment. FIG. 7 shows exemplary timing waveforms of various signals described with reference to FIG. 1 through FIG. 6 including V_N_wire, Clock_32, SW_WALL, VR_DC, Vamp_dc, Vo_dc, Pv1, Pv2, Pv3, ..., Pvn-1, and Pvn, Ven_sensor, Clock_sen, and Vout_sensor. It is understood that the waveforms shown in FIG. 7 are only exemplary, and other waveforms having different frequencies, amplitudes, and signal levels may be used without deviating from the scope of the present disclosure.

During a power normal condition, the voltage V_N_wire may have a wave form of 5 mV AC as described above. A clock generator (not shown) generates the clock signal Clock_32 having n (e.g., 32) clock pulses. SW_WALL is a starting pulse that is input to the D-type flip-flop counter 600 in FIG. 6 and is used to start an automatic calibration using the auto calibration feedback amplifier 500 shown in FIG. 5.

Referring to FIG. 2 and FIG. 7, VR_dc (e.g., 1.85V) refers to a reference DC voltage that is fed to the amplifier U4 of the comparator 215. Referring to FIG. 5 and FIG. 7, Vo_dc refers to the input voltage to the auto calibration feedback amplifier 500, and Vamp_dc refers to the amplified output of the auto calibration feedback amplifier 500. Pv1, Pv1, Pv3, Pvn-1, and Pvn are output pulses of the D-type flip-flop counter 600 shown in FIG. 6. Ven_sensor refers to an output of the amplifier U4 of the comparator 215 shown in FIG. 2. Clock_sen is an output signal of the NOR2 gate shown in FIG. 6. Vout_sensor is an output signal of the power driver block 300 shown in FIG. 3.

In the example discussed above, when the power condition is normal, V_N_wire has an amplitude of 5 mV AC. In a case where the voltage gain of the voltage sense amplifier 212 is 10, Vo_dc that is output from the ADC 214 has 50 mV DC.

The auto calibration feedback amplifier 217 may amplify the input voltage Vo_dc to a target level of Vamp_dc based on the following values ad equations. It is understood that this example is used to describe the inventive concept of the present disclosure, and the example values used herein may vary without deviating from the inventive concept of the present disclosure.

Vo_dc=50 mV, VR_dc=1.85V, and Vcc=3.0V
Rv1=50K ohm,
Rv2_0=50K ohm, Rv2_1=10K ohm, Rv2_2=9K ohm, . . . , Rv2_n−1=0.2K ohm, Rv2_n=0.1K ohm, $$Av=((Rv1/Rv2\_eq)+1), \text{ and}$$

$$Rv2\_eq=Rv2\_0//Rv2\_1//Rv2\_2// \ldots //Rv2\_n-1//Rv2\_n.$$

The auto calibration process may start with toggling of the enable signals Pv1, Pv2, . . . Pvn to sequentially turn on the NMOS transistors NMOS1, NMOS2, NMOS3, . . . NMOSn.
1) At the beginning of the auto calibration, Pv1, Pv2, . . . , Pvn are all 'Low' so that all NMOS are turned off. In this case, the voltage gain Av of the amplifier U9 is ((Rv1/Rv2_0)+1)=2, and Vamp_dc=100 mV;
2) When Pv1 is 'High', others are low', so that NMOS1 is turned on. In this case, Av=((Rv1/(Rv2_0//Rv2_1))+1)=11, and Vamp_dc=550 mV.
3) When Pv2 is 'High', others are low', so that NMOS2 is turned on. In this case, Av=((Rv1/(Rv2_0//Rv2_2))+1)=17, and Vamp_dc=850 mV.
4) When Pv3 is 'High', others are low', so that NMOS3 turned on. In this case, Av=((Rv1/(Rv2_0//Rv2_3))+1)=23, and Vamp_dc=1.15V.
5) When Pv4 is 'High', others are low', so that NMOS4 is turned on. In this case, Av=((Rv1/(Rv2_0//Rv2 4))+1)=30, and Vamp_dc=1.5V.
6) When Pv5 is 'High', others are low', so that NMOS5 is turned on. In this case, Av=((Rv1/(Rv2_0//Rv2 5))+1)=38, and Vamp_dc=1.9V.
. . .
7) When Pvn is 'High', others are low', so that NMOSn is turned on. In this case, Av=((Rv1/(Rv2_0//Rv2_n))+1)=500, and Vamp_dc=3.0V.

| Calibration Step | Enable Signals (High) | Transistor (ON) | Gain Av | Vamp_dc (mV) |
| --- | --- | --- | --- | --- |
| 0 | None | None | 2 | 100 |
| 1 | Pv1 | NMOS1 | 11 | 550 |
| 2 | Pv2 | NMOS2 | 17 | 850 |
| 3 | Pv3 | NMOS3 | 23 | 1150 |
| 4 | Pv4 | NMOS4 | 30 | 1500 |
| 5 | Pv5 | NMOS5 | 38 | 1900 |
| . . . | | | | |
| n | Pvn | NMOSn | 500 | 3000 |

When SW_WALL is changed from 'High' to 'Low,' i.e., when the switch 105 of FIG. 1 (e.g., a wall switch of a power blackout sensing system) is turned off, an auto calibration cycle may start, and the enable signals Pv1, Pv2, Pvn−1, Pvn are asserted in a sequence in each pulse of Clock_32. The voltage gain Av increases (e.g., 2, 11, 17, 23, 30, 38, . . . , 500) corresponding to the sequence of the enable signals Pv1, . . . , Pvn until it reaches the voltage level of the reference voltage VR_dc (e.g., 1.85V). If Vamp_dc (e.g., 1.9V) becomes higher than the reference voltage VR_dc (e.g., 1.85V), in the present example at Pv5 pulse being high and Av=38, then the signal Ven_sensor becomes 'Low.' Clock_sen signal is then disabled by the Ven_sensor signal that is toggled low and keeps its disabled status until the auto calibration cycle finishes. In one embodiment, after the calibration cycle may be completed without cycling through the remaining pulses Pv5, Pv6, etc. The power blackout sensing system may understand that Ven_sensor being low is a normal power status, and Ven_sensor being high is a power outage status. Vo_dc may change due to a difference of electric envelopments and/or operating conditions. To account for these system-dependent differences and improve accuracy of a blackout condition detection, the auto calibration cycle may be performed, for example, in a switch-off period (e.g., SW_WALL is low), to adapt to detect an optimal voltage gain Av and generate an optimal output voltage Vamp_dc that is fed to the comparator 215 to account for the.

Figure 8:
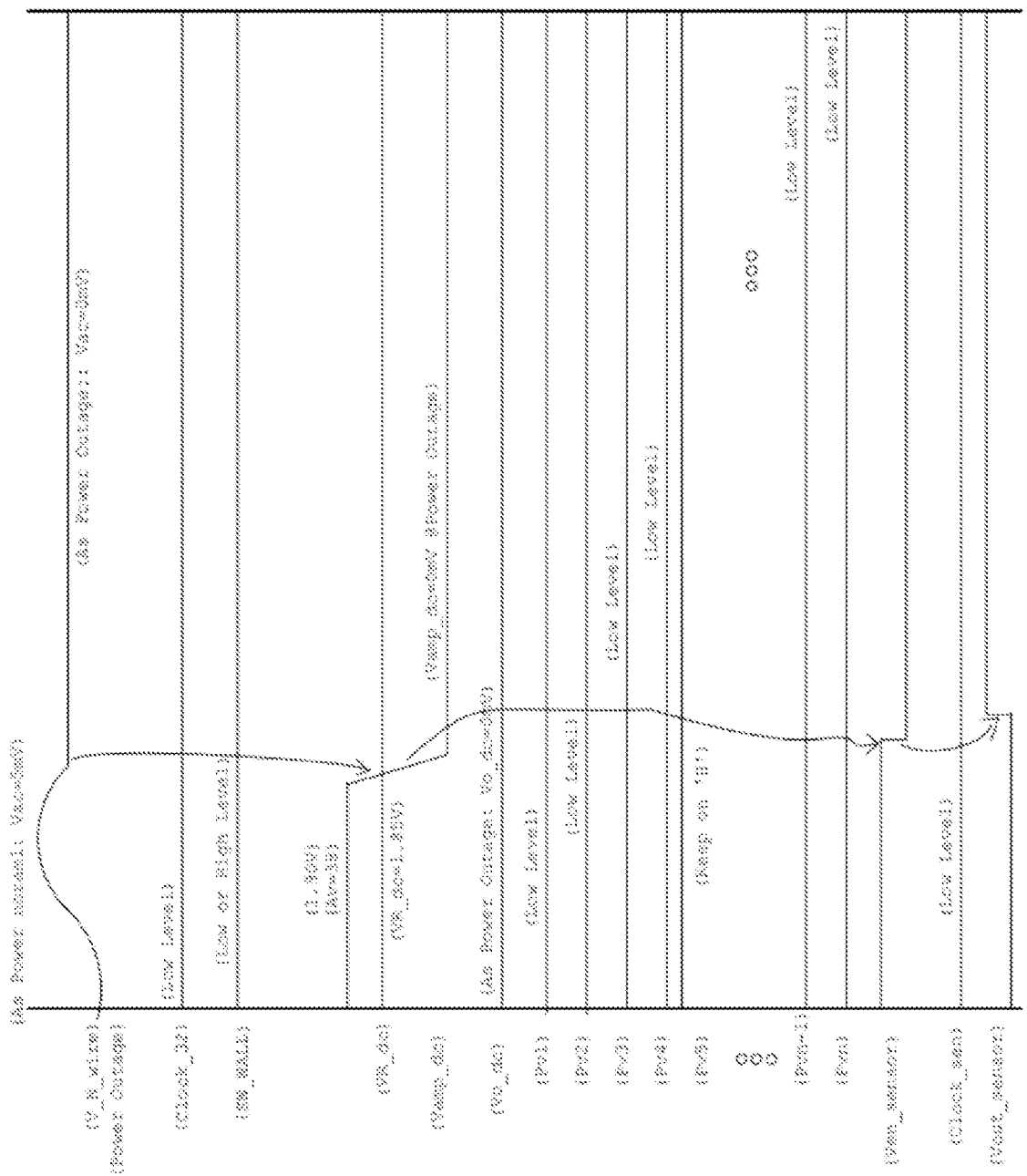
FIG. 8 shows an example timing diagram in a power outage condition, according to one embodiment.

FIG. 8 shows an example timing diagram in a power outage condition, according to one embodiment. Vo_dc may change from 50 mV to 0V when a power outage occurs. Clock_32 may stay low' and disabled because the auto calibration has ended. Even if the auto calibration feedback amplifier 217 in FIG. 2 keeps on same Av=38, Vamp_dc is 0V. Therefore, Ven_sensor becomes low, and Vout_sensor becomes high. Vout_sensor being high indicates a power outage condition, and the power blackout sensing system may indicate the power outage condition using the LED light 414 that is powered by the secondary power of the battery 416 (see FIG. 4).

According to one embodiment, a calibration amplifier includes: a plurality of transistors and a variable resistor configured to change in response to clock pulses. During a calibration cycle, one of the plurality of transistors switches on in each calibration step based on a plurality of enable signals, and a gain of the calibration amplifier changes until an output voltage of the calibration amplifier exceeds a reference voltage and is set to a calibrated gain. The calibration amplifier outputs the output voltage by amplifying an input voltage using the calibrated gain.

The variable resistor may include a plurality of resistors connected in parallel and to a respective one of the plurality of transistors, and each of the plurality of resistors may be set to a predetermined resistor value.

The calibration amplifier may further include a flip-flop counter that generates the plurality of enable signals, and each of the plurality of enable signals may correspond to a respective one of the clock pulses.

The reference voltage may be a fixed voltage.

The calibration cycle may start in response to a switch-off signal of a power blackout sensing system.

The power blackout sensing system may include a voltage comparator that outputs a sensor voltage signal based on a comparison between the output voltage of the calibration amplifier and a voltage of a neutral wire, and the sensor voltage signal may be a voltage of a secondary power source during a switch-on period and a switch-off period.

The reference voltage may be determined based on a voltage of the secondary power source.

The sensor voltage signal may remain low after the output voltage of the calibration amplifier exceeds the reference voltage.

The sensor voltage signal may be high during a blackout period regardless of the switch-on period or the switch-off period indicating a power outage condition.

The power blackout sensing system may further include an AC-to-DC (ADC) converter, and the input voltage of the calibration amplifier may be an output voltage of the ADC converter.

According to another embodiment, a power blackout sensing system includes: a voltage regulator configured to receive one of three phase wires and a neutral wire of a primary power source that provides an alternating current (AC) power; a calibration amplifier comprising a plurality of transistors and a variable resistor that is configured to change in response to clock pulses; a voltage sense amplifier; a sensing block configured to receive the neutral wire of the primary power source and comprising a coupled inductor device and the voltage sense amplifier; and a secondary power source. The voltage regulator is coupled to a switch and generates a direct current (DC) voltage signal. The coupled inductor device of the sensing block comprises a pull-down resistor, wherein the coupled inductor device is configured to convert a voltage signal of the neutral wire to a 180-degree phase-shifted voltage signal of the neutral wire and generate a reference voltage signal using the pull-down resistor. The voltage sense amplifier is configured to amplify a voltage gap between the 180-degree phase-shifted voltage signal of the neutral wire and the reference voltage signal. During a calibration cycle, one of the plurality of transistors of the calibration amplifier switches on in each calibration step based on a plurality of enable signals, and a gain of the calibration amplifier changes until an output voltage of the calibration amplifier exceeds the reference voltage and is set to a calibrated gain. The calibration amplifier outputs the output voltage by amplifying an input voltage using the calibrated gain. The sensing block detects a phantom voltage on the one of three phase wires and provides an output signal corresponding the secondary power source during a blackout period.

The power blackout sensing system may further include a voltage comparator that is configured to output a sensor voltage signal. The sensor voltage signal may be a voltage of the secondary power source during a switch-on period and a switch-off period, and the sensor voltage signal may be zero during the blackout period.

The variable resistor of the calibration amplifier may include a plurality of resistors connected in parallel and to a respective one of the plurality of transistors, and each of the plurality of resistors may be set to a predetermined resistor value.

The calibration amplifier may further include a flip-flop counter that generates the plurality of enable signals, and each of the plurality of enable signals may correspond to a respective one of the clock pulses.

The reference voltage may be a fixed voltage.

The calibration cycle may start in response to a switch-off signal.

The reference voltage may be determined based on a voltage of the secondary power source.

The sensor voltage signal may remain low after the output voltage of the calibration amplifier exceeds the reference voltage.

The sensor voltage signal may be high during a blackout period regardless of the switch-on period or the switch-off period indicating a power outage condition.

The power blackout sensing system may further include an AC-to-DC (ADC) converter. The ADC converter may receive an AC voltage from the voltage sense amplifier and provide a DC voltage to the calibration amplifier as the input voltage of the calibration amplifier.

The above example embodiments have been described hereinabove to illustrate various embodiments of implementing a power blackout sensing system including a phantom voltage detector. Various modifications and departures from the disclosed example embodiments will occur to those having ordinary skill in the art. The subject matter that is intended to be within the scope of the invention is set forth in the following claims.

What is claimed is:

1. A calibration amplifier comprising:
   a plurality of transistors; and
   a variable resistor configured to change in response to clock pulses,
   wherein, during a calibration cycle, the plurality of transistors sequentially switch on based on a plurality of enable signals, and a gain of the calibration amplifier changes until an output voltage of the calibration amplifier exceeds a reference voltage and is set to a calibrated gain, and
   wherein the calibration amplifier outputs the output voltage by amplifying an input voltage using the calibrated gain.

2. The calibration amplifier of claim 1, wherein the variable resistor comprises a plurality of resistors connected in parallel and to a respective one of the plurality of transistors, and
   wherein each of the plurality of resistors is set to a predetermined resistor value.

3. The calibration amplifier of claim 1, further comprising a flip-flop counter that generates the plurality of enable signals, and each of the plurality of enable signals corresponds to a respective one of the clock pulses.

4. The calibration amplifier of claim 1, wherein the reference voltage is a fixed voltage.

5. The calibration amplifier of claim 1, wherein the calibration cycle starts in response to a switch-off signal of a power blackout sensing system.

6. The calibration amplifier of claim 5, wherein the power blackout sensing system comprises a voltage comparator that outputs a sensor voltage signal based on a comparison between the output voltage of the calibration amplifier and a voltage of a neutral wire, and
   wherein the sensor voltage signal is a voltage of a secondary power source during a switch-on period and a switch-off period.

7. The calibration amplifier of claim 6, wherein the reference voltage is determined based on a voltage of the secondary power source.

8. The calibration amplifier of claim 6, wherein the sensor voltage signal remains low after the output voltage of the calibration amplifier exceeds the reference voltage.

9. The calibration amplifier of claim 8, wherein the sensor voltage signal is high during a blackout period regardless of the switch-on period or the switch-off period indicating a power outage condition.

10. The calibration amplifier of claim 6, wherein the power blackout sensing system further comprises an AC-to-DC (ADC) converter, and the input voltage of the calibration amplifier is an output voltage of the ADC converter.

11. A power blackout sensing system comprising:
   a voltage regulator configured to receive one of three phase wires and a neutral wire of a primary power source that provides an alternating current (AC) power;
   a calibration amplifier comprising a plurality of transistors and a variable resistor that is configured to change in response to clock pulses;
   a voltage sense amplifier;
   a sensing block configured to receive the neutral wire of the primary power source and comprising a coupled inductor device and the voltage sense amplifier; and
   a secondary power source,
   wherein the voltage regulator is coupled to a switch and generates a direct current (DC) voltage signal, and
   wherein the coupled inductor device of the sensing block comprises a pull-down resistor, wherein the coupled inductor device is configured to convert a voltage signal of the neutral wire to a 180-degree phase-shifted voltage signal of the neutral wire and generate a reference voltage signal using the pull-down resistor, wherein the voltage sense amplifier is configured to amplify a voltage gap between the 180-degree phase-shifted voltage signal of the neutral wire and the reference voltage signal, wherein, during a calibration cycle, the plurality of transistors of the calibration amplifier sequentially switch on based on a plurality of enable signals, and a gain of the calibration amplifier changes until an output voltage of the calibration amplifier exceeds the reference voltage and is set to a calibrated gain, wherein the calibration amplifier outputs the output voltage by amplifying an input voltage using the calibrated gain, and wherein the sensing block detects a phantom voltage on the one of three phase wires and provides an output signal corresponding the secondary power source during a blackout period.

12. The power blackout sensing system of claim 11, further comprises a voltage comparator that is configured to output a sensor voltage signal, wherein the sensor voltage signal is a voltage of the secondary power source during a switch-on period and a switch-off period, and the sensor voltage signal is zero during the blackout period.

13. The power blackout sensing system of claim 12, wherein the sensor voltage signal remains low after the output voltage of the calibration amplifier exceeds the reference voltage.

14. The power blackout sensing system of claim 13, wherein the sensor voltage signal is high during a blackout period regardless of the switch-on period or the switch-off period indicating a power outage condition.

15. The power blackout sensing system of claim 11, wherein the variable resistor of the calibration amplifier comprises a plurality of resistors connected in parallel and to a respective one of the plurality of transistors, and wherein each of the plurality of resistors is set to a predetermined resistor value.

16. The power blackout sensing system of claim 11, wherein the calibration amplifier further comprises a flip-flop counter that generates the plurality of enable signals, and each of the plurality of enable signals corresponds to a respective one of the clock pulses.

17. The power blackout sensing system of claim 11, wherein the reference voltage is a fixed voltage.

18. The power blackout sensing system of claim 11, wherein the calibration cycle starts in response to a switch-off signal.

19. The power blackout sensing system of claim 11, wherein the reference voltage is determined based on a voltage of the secondary power source.

20. The power blackout sensing system of claim 11, wherein the power blackout sensing system further comprises an AC-to-DC (ADC) converter, wherein the ADC converter receives an AC voltage from the voltage sense amplifier and provides a DC voltage to the calibration amplifier as the input voltage of the calibration amplifier.

* * * * *